(12) United States Patent
Liu et al.

(10) Patent No.: US 11,031,662 B2
(45) Date of Patent: Jun. 8, 2021

(54) LOW TEMPERATURE CO-FIRED CERAMIC BAND-PASS FILTER

(71) Applicant: AAC Technologies Pte. Ltd., Singapore (SG)

(72) Inventors: Zenan Liu, Shenzhen (CN); Ya Wang, Shenzhen (CN); Yongli Chen, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/705,260

(22) Filed: Dec. 6, 2019

(65) Prior Publication Data
US 2020/0203793 A1    Jun. 25, 2020

(30) Foreign Application Priority Data
Dec. 24, 2018 (CN) .......................... 201811581837.4

(51) Int. Cl.
*H01P 1/203* (2006.01)
*H03H 1/00* (2006.01)
*H03H 7/09* (2006.01)

(52) U.S. Cl.
CPC .......... *H01P 1/20345* (2013.01); *H01P 1/203* (2013.01); *H03H 1/0007* (2013.01); *H03H 7/09* (2013.01); *H03H 2001/0085* (2013.01)

(58) Field of Classification Search
CPC ................ H01P 1/203; H01P 1/20345; H03H 2001/0085; H03H 7/09
USPC ................................ 333/175, 185, 204, 205
See application file for complete search history.

(56) References Cited

U.S. PATENT DOCUMENTS 5,892,415 A * 4/1999 Okamura ............ H01P 1/20345
                                                       333/175
9,035,724 B2 * 5/2015 Imamura ............. H01P 1/20345
                                                       333/185

\* cited by examiner

*Primary Examiner* — Rakesh B Patel
(74) *Attorney, Agent, or Firm* — W&G Law Group LLP

(57) ABSTRACT

The present application provides an LTCC band-pass filter, including a shell and a filtering assembly. The shell includes a top wall and a bottom wall. The filtering assembly includes a first layer, two second layers respectively overlapped on two opposite sides of the first layer, two third layers respectively overlapped on two sides of the two second layers far away from the first layer, and a fourth layer sandwiched between one of the second layers and the third layers. The first layer is served as an inductance L. The second layer is served as a grounding capacitor C. The second layer and the first layer are coupled together to form an LC resonance unit. The third layer is connected with the ground, and is served as a shielding layer of the LTCC band-pass filter.

7 Claims, 9 Drawing Sheets

LOW TEMPERATURE CO-FIRED CERAMIC BAND-PASS FILTER

TECHNICAL FIELD

The present disclosure relates to a field of band-pass filter, specifically relates to a low temperature co-fired ceramic (LTCC) band-pass filter.

BACKGROUND

The fifth-generation communication technology (5G) is directed to constructing an ecological system of information and communication technologies, and is one of the most important topics in the present industry. Differing from the previous second-generation communication technology (2G), third-generation communication technology (3G), fourth-generation communication technology (4G), 5G not only upgrades and updates mobile communication technology, but it is also a driving platform for a future digital world and a basic facility for development of an Internet of Things, which truly establishes a new time of full connection. A 5G frequency spectrum newly adds two frequency bands, and the two frequency bands comprises Sub 6G and an ultrahigh frequency. A frequency band of the Sub 6G comprises 3.3 GHz-3.6 GHz and 4.8 GHz-5.0 GHz, which provides a continuous frequency spectrum of 100-200 MHz. In the future, with advancing of a 4G, 5G network and performing of a 5G network, communication frequency bands of mobile phones are greatly increased, so that requirement of filters is driven to increase.

Due to a fact that the frequency band of Sub 6G in the 5G frequency spectrum belongs to a newly added frequency band, including 3.3 GHz-3.6 GHz and 4.8 GHz-5.0 GH, kinds of band-pass filters directed to low temperature co-fired ceramic (LTCC) in market are small. Meanwhile, the present filters only cover a single frequency band of the two frequency bands of the Sub 6G. In the prior art, the defects are that most filters on the market are not comprehensive in coverage of the Sub 6G frequency spectrum, and are not compatible while using.

BRIEF DESCRIPTION OF DRAWINGS

In order to more clearly illustrate technical solutions in embodiments of the present disclosure, the drawings used in the description of the embodiments will be briefly described below. Apparently, the drawings in the following description are merely some of the embodiments of the present disclosure, and those skilled in the art are able to obtain other drawings according to the drawings without contributing any inventive labor. In the drawing.

DETAILED DESCRIPTION OF THE EXEMPLARY EMBODIMENT

Figure 1:
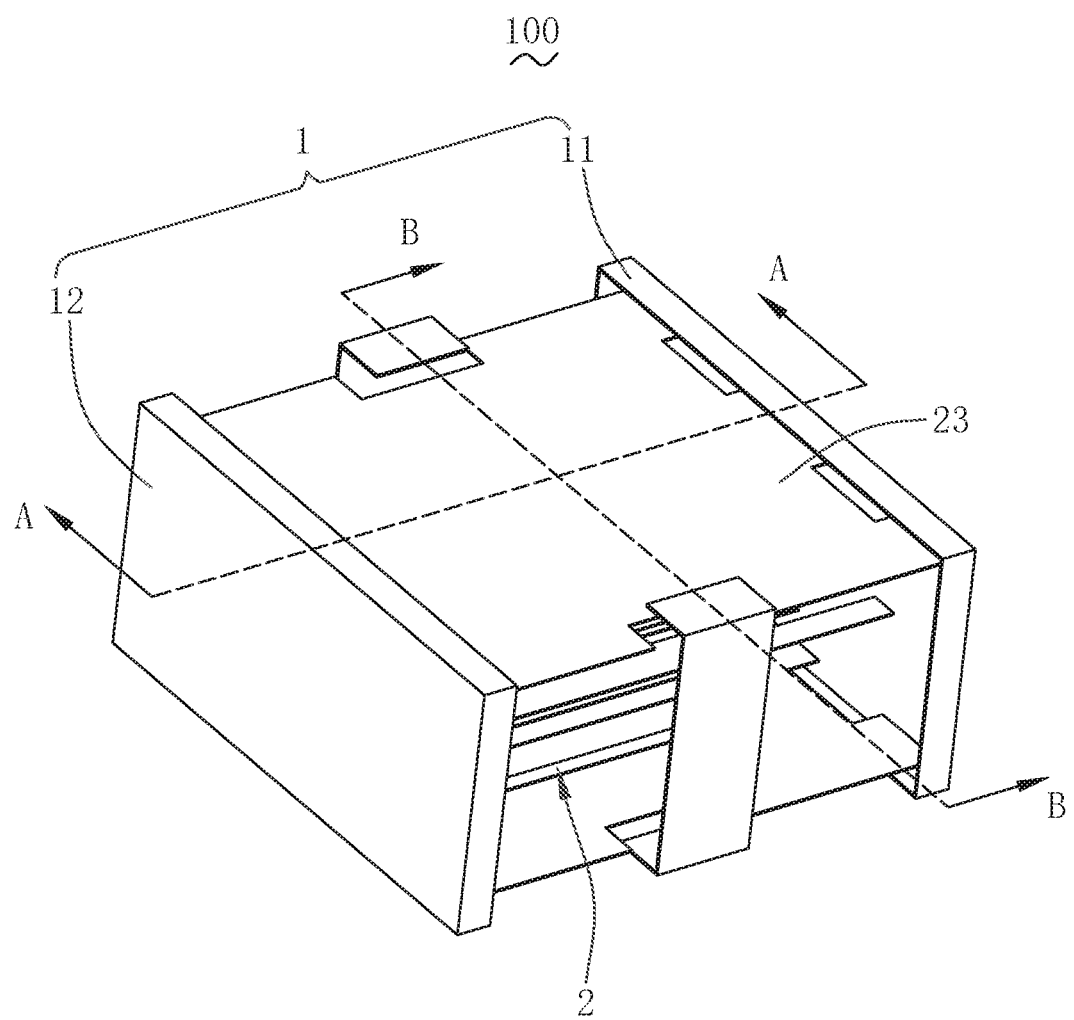
FIG. 1 is a perspective view of an LTCC band-pass filter of the present disclosure.
Figure 2:
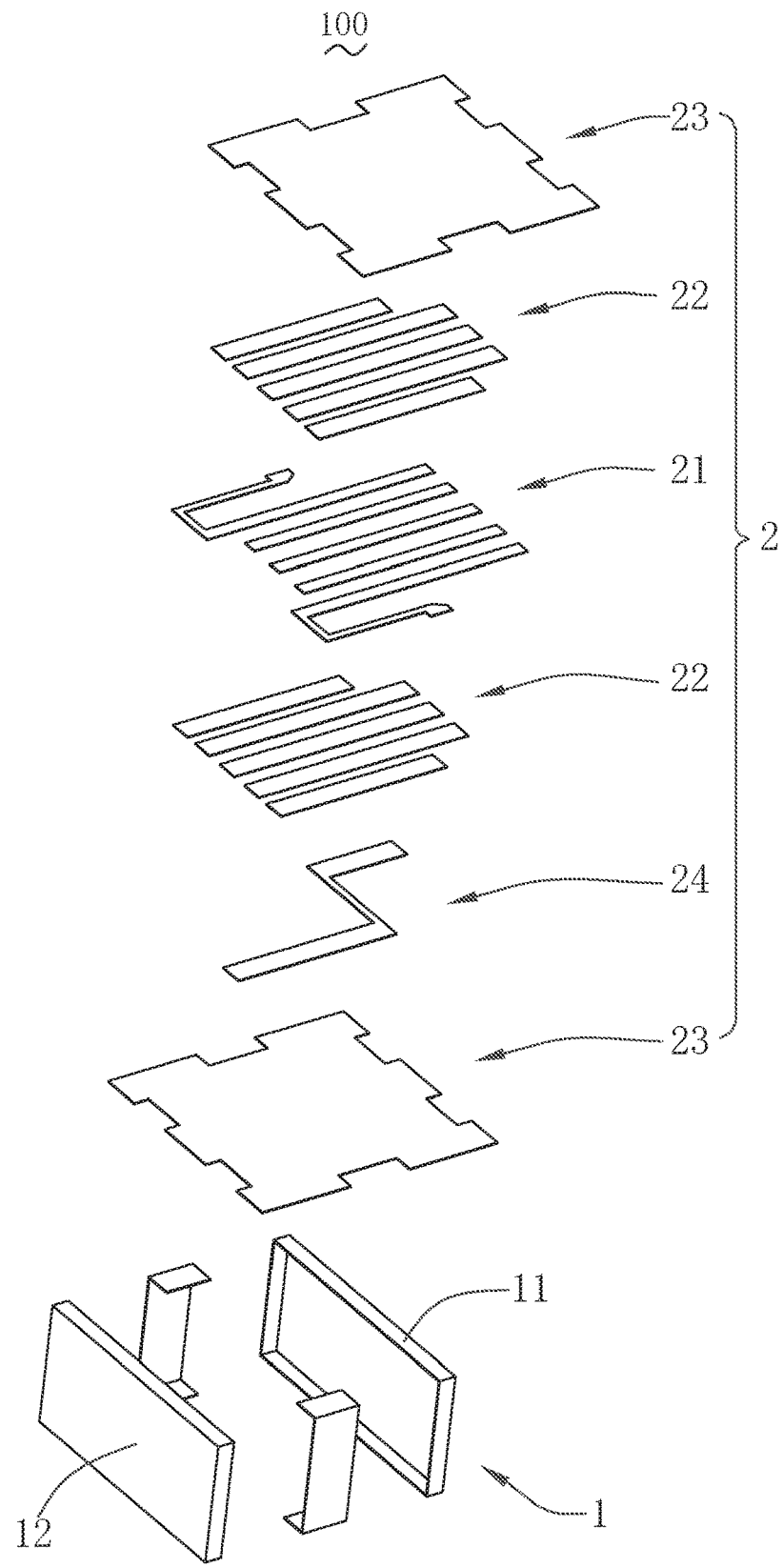
FIG. 2 is a perspective exploded view of the LTCC band-pass filter of the present disclosure.
Figure 3:
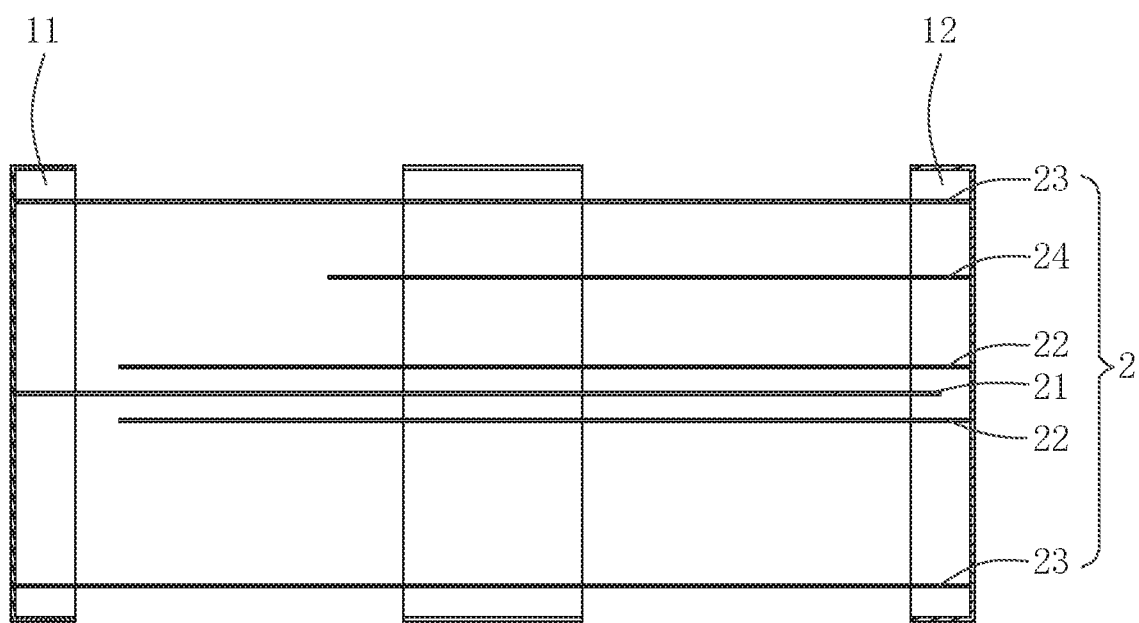
FIG. 3 is a cross sectional view taken along a line A-A shown in FIG. 1.
Figure 4:
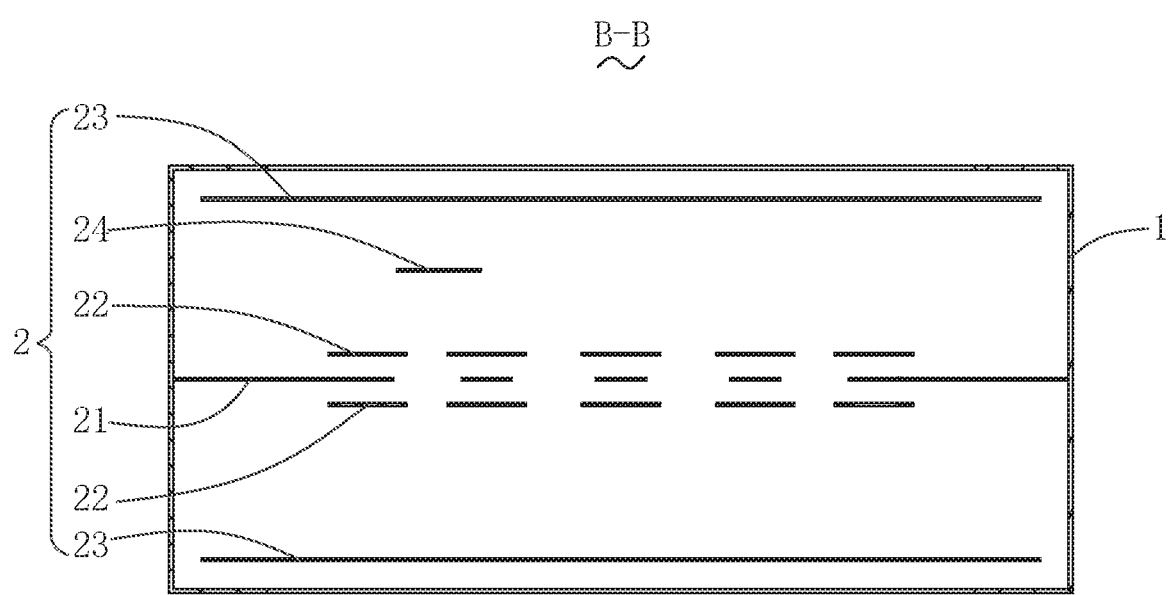
FIG. 4 is a cross sectional view taken along a line B-B shown in FIG. 1.

The technical solutions in the embodiment of the present disclosure will be clearly and completely described in conjunction with the drawings in the embodiment of the present disclosure. It is obvious that the described embodiment is only a part of the embodiments of the present disclosure, and not all of them. All other embodiments obtained by those skilled in the art based on the embodiment of the present disclosure without creative efforts are within the scope of the present disclosure.

As shown in FIGS. 1-4, the present disclosure provides an LTCC band-pass filter 100. The LTCC band-pass filter 100 comprises a shell 1 and a filtering assembly 2 received in the shell 1 and fixed thereto.

The shell 1 comprises a top wall 11 and a bottom wall 12 opposite to the top wall 11. In one embodiment, the shell 1 has a rectangular cube shape, such as a cuboid shape.

The filtering assembly 2 has a LTCC multilayer structure. The filtering assembly 2 comprises a first layer 21, two second layers 22 respectively overlapped on two opposite sides of the first layer 21, two third layers 23, each of the third layers 23 overlapped on a side of the second layer 22 far away from the first layer 21, and a fourth layer 24 sandwiched between one of the second layers 22 and the third layers 23. The first layer 21, the second layers 22, the third layers 23 and the fourth layer 24 are perpendicular to the top wall 11.

Figure 5:
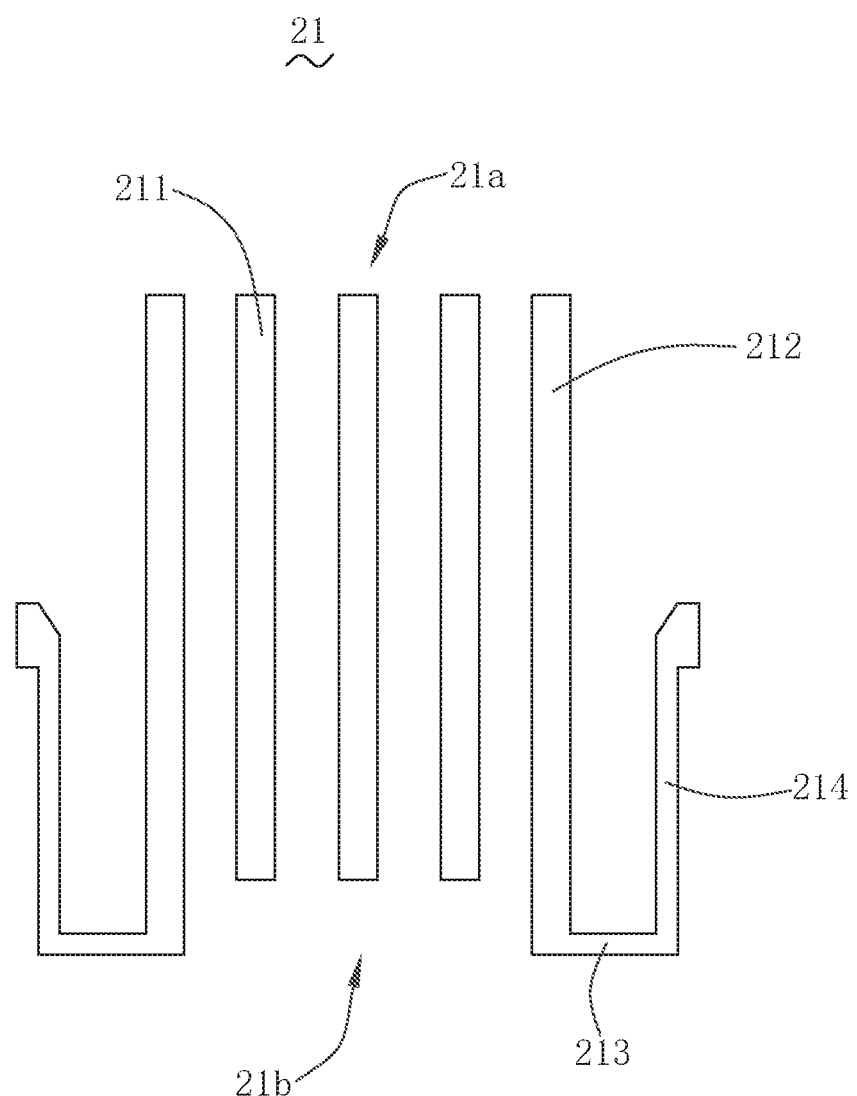
FIG. 5 is a schematic structural view of a first layer of the LTCC band-pass filter of the present disclosure.

Referring to FIG. 5, the first layer 21 comprises a first layer top end 21a close to the top wall 11 and a first layer bottom end 21b close to the bottom wall 12, the first layer top end 21a is grounded, the first layer bottom end 21b forms an open circuit state, and the first layer 21 is served as an inductance L.

Specifically, the first layer 21 comprises three first conductors 211, two second conductors 212, two connecting bodies 213, and two third conductors 214. The three first conductors 211 are disposed in parallel and disposed at intervals, the two second conductors 212 are respectively disposed on two opposite sides of the first conductors 211. Each of two connecting bodies 213 extends perpendicularly from an end of the corresponding second conductor 212 close to the bottom wall 12 in a direction far away from the first conductors 211. Each of the third conductors 214 extends from the corresponding connecting body 213 in a direction towards the top wall 11 and parallel to the first conductors 211. The first conductor 211, the second conductor 212, and the third conductor 214 are parallel to each other and are disposed at intervals. Ends of the first conductors 211 and the second conductors 212 close to the top wall 11 are flush with each other, and ends of the first conductors 211 close to the bottom wall 12 are further away from the bottom wall 12 than ends of the second conductors 212 close to the bottom wall 12.

Figure 6:
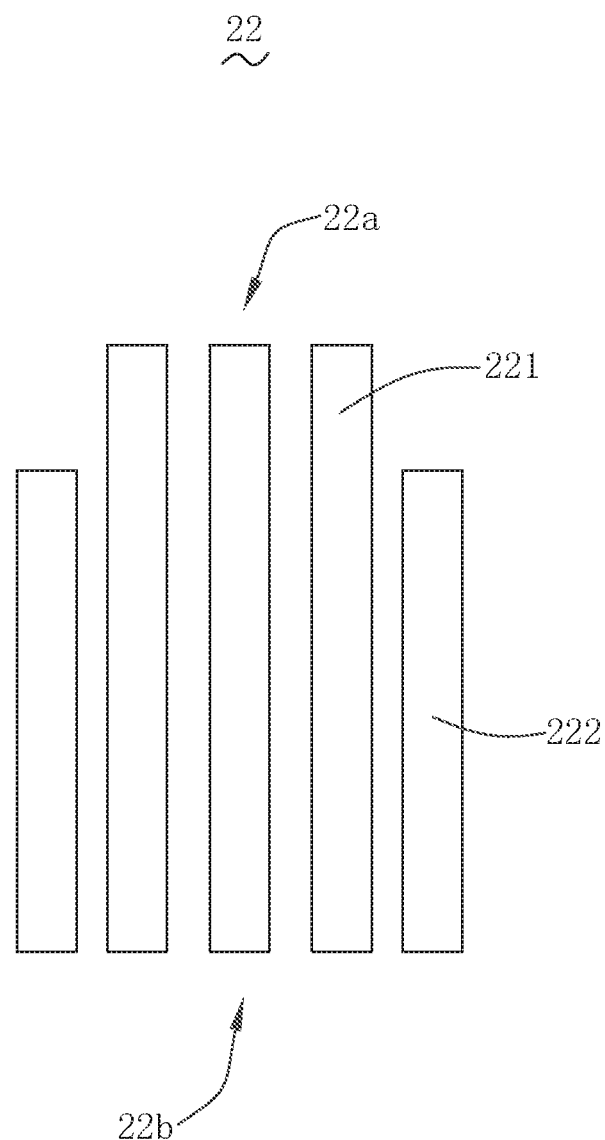
FIG. 6 is a schematic structural view of a second layer of the LTCC band-pass filter of the present disclosure.

Referring to FIG. 6, the second layer 22 comprises a second layer top end 22a close to the top wall 11 and a second layer bottom end 22b close to the bottom wall 12, the second layer top end 22a forms the open circuit state, the second layer bottom end 22b is grounded, the second layer 22 is served as a grounding capacitor C, the second layer 22 and the first layer 21 are coupled together to form an LC resonance unit.

Specifically, the second layer 22 comprises three fourth conductors 221 and two fifth conductors 222. The three fourth conductors 221 are parallel to each other and disposed at intervals, and two fifth conductors 222 are respectively disposed on two opposite sides of the fourth conductors 221. The fifth conductors 222 and the fourth conductors 221 are parallel to each other and disposed at intervals. Ends of the fourth conductors 221 and the fifth conductors 222 close to the bottom wall 12 are flush with each other. Ends of the fifth conductors 222 close to the top wall 11 are further away from the top wall 11 than ends of the fourth conductors 221 close to the top wall 11.

In one embodiment, the three fourth conductors 221 are respectively overlapped on the three first conductors 211 to form coupling, and the two fifth conductors 222 are respectively overlapped on the two second conductors 212 to form coupling.

Figure 7:
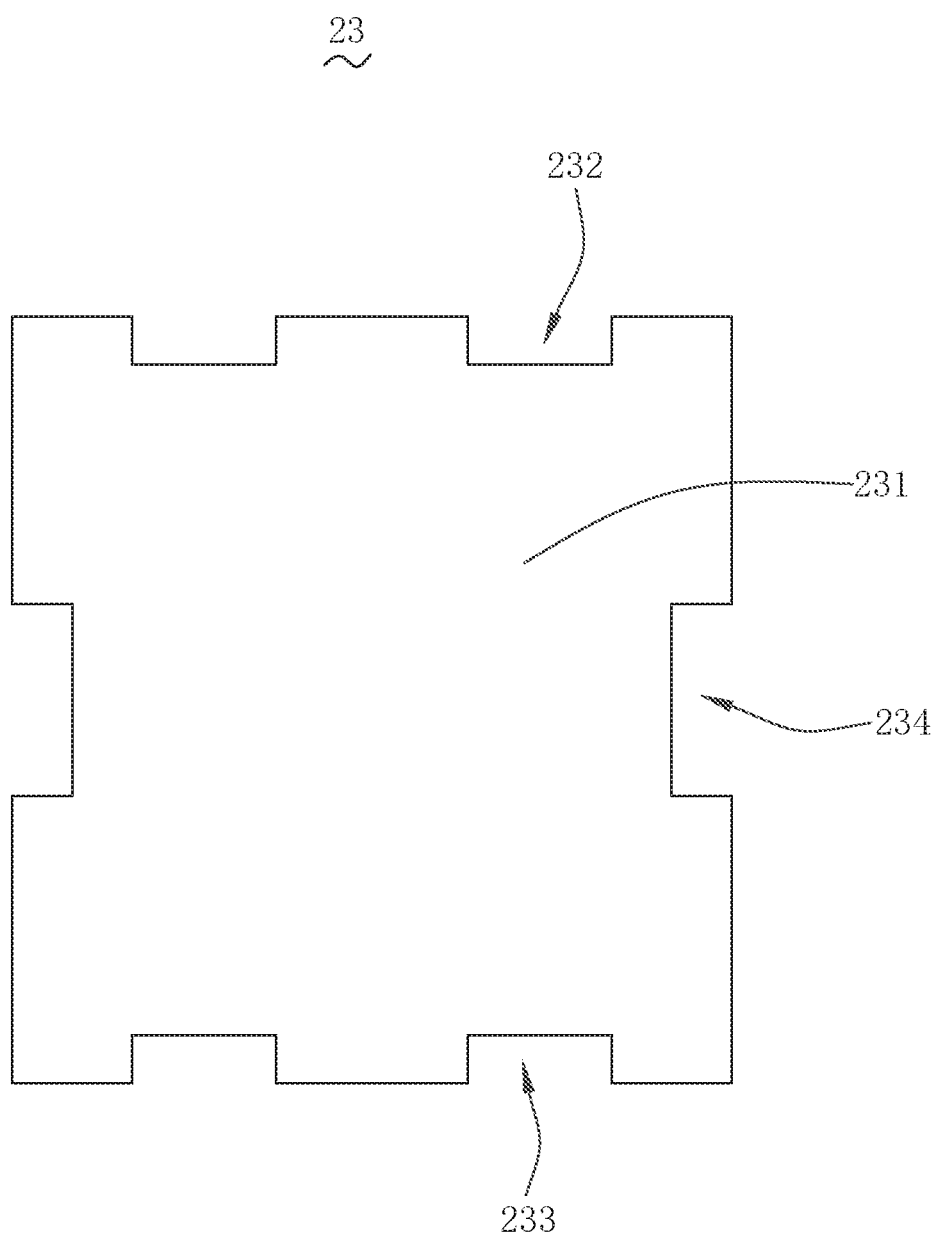
FIG. 7 is a schematic structural view of a third layer of the LTCC band-pass filter of the present disclosure.

Referring to FIG. 7, the third layer 23 is grounded, and is served as a shielding layer of the LTCC band-pass filter 100. The third layer 23 is configured for shielding an electronic interference caused by clutter in circuits of the filtering assembly 2 to ensure stability when the LTCC band-pass filter 100 works.

Specifically, the third layer 23 comprises a flat plate body 231, two top-end notches 232, two bottom-end notches 233, and two side-end notches 234. The two top-end notches 232 are disposed at intervals at an end of the flat plate body 231 close to the top wall 11. The two bottom-end notches 233 are disposed at intervals at an end of the flat plate body 231 close to the bottom wall 12, and the two side-end notches 234 are respectively disposed at two side ends of the flat plate body 231.

In one embodiment, orthographic projections of the first layer 21 and the second layer 22 respectively on the third layer 23 are at least partially located in the third layer 23. Two ends of the first conductors 211 of the first layer 21 close to the top wall 11 and close to the second conductors 212 are respectively directly aligned with the two top-end notches 232. Ends of the second conductors 212 of the first layer 21 close to the top wall 11 are directly aligned with the two top-end notches 232. The two third conductors 214 of the first layer 21 respectively extend to be directly aligned with the two side-end notches 234. Two ends of the fourth conductors 221 close to the top wall 11 and close to the fifth conductors 222 of the second layer 22 are respectively directly aligned with the two top-end notches 232.

Figure 8:
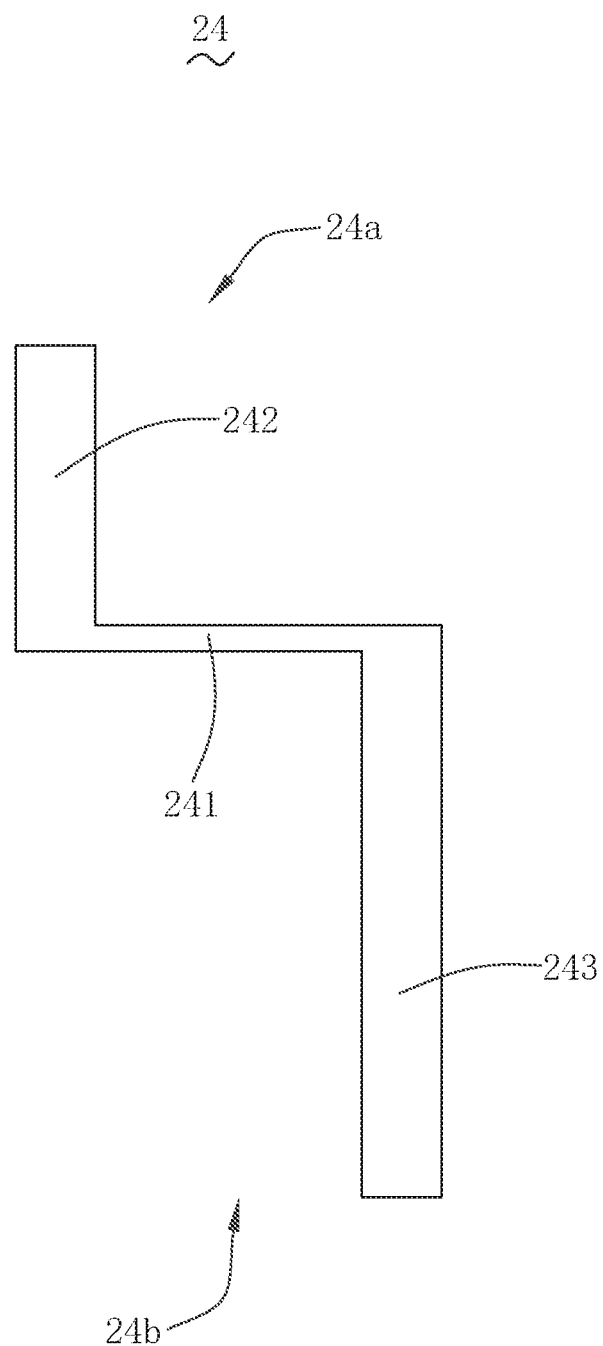
FIG. 8 is a schematic structural view of a fourth layer of the LTCC band-pass filter of the present disclosure.

Referring to FIG. 8, the fourth layer 24 comprises a fourth layer top end 24a close to the top wall 11 and a fourth layer bottom end 24b close to the bottom wall 12. Both the fourth layer top end 24a and the fourth layer bottom end 24b form the open circuit state. The fourth layer 24 is configured for introducing electrical cross coupling between the first layer 21 and the second layer 22, so that selectivity of the LTCC band-pass filter is improved, and an edge of the passband is steeper.

Specifically, the fourth layer 24 comprises a main body part 241, a first extending part 242, and a second extending part 243. The main body part 241 is parallel to the top wall 11 and is spaced apart from the top wall 11, the first extending part 242 extends perpendicularly from one end of the main body part 241 and extends in a direction toward the top wall 11, and the second extending part 243 extends perpendicularly from another end of the main body part 241 and extends toward the bottom wall 12.

In one embodiment, an end of first extending part 242 close to the top wall 11 is directly aligned with one of the top-end notches 232, and an end of the second extending part 243 close to the bottom wall 12 is aligned with one of the bottom-end notches 233.

The ends of the first conductors 211 of the first layer 21 close to the bottom wall 12 are further away from the bottom wall 12 than ends of the fourth conductors 221 of the second layer 22 close to the bottom wall 12, and ends of the first conductors 211 close to the top wall 11 are flush with ends of the fourth conductors 221 close to the top wall 11.

The ends of the second conductors 212 of the first layer 21 close to the bottom wall 12 are flush with ends of the fifth conductors 222 of the second layer 22 close to the bottom wall, and the ends of the second conductors 212 near the top wall 11 are closer to the top wall 11 than the ends of the fifth conductors 222 near the top wall 11.

Figure 9:
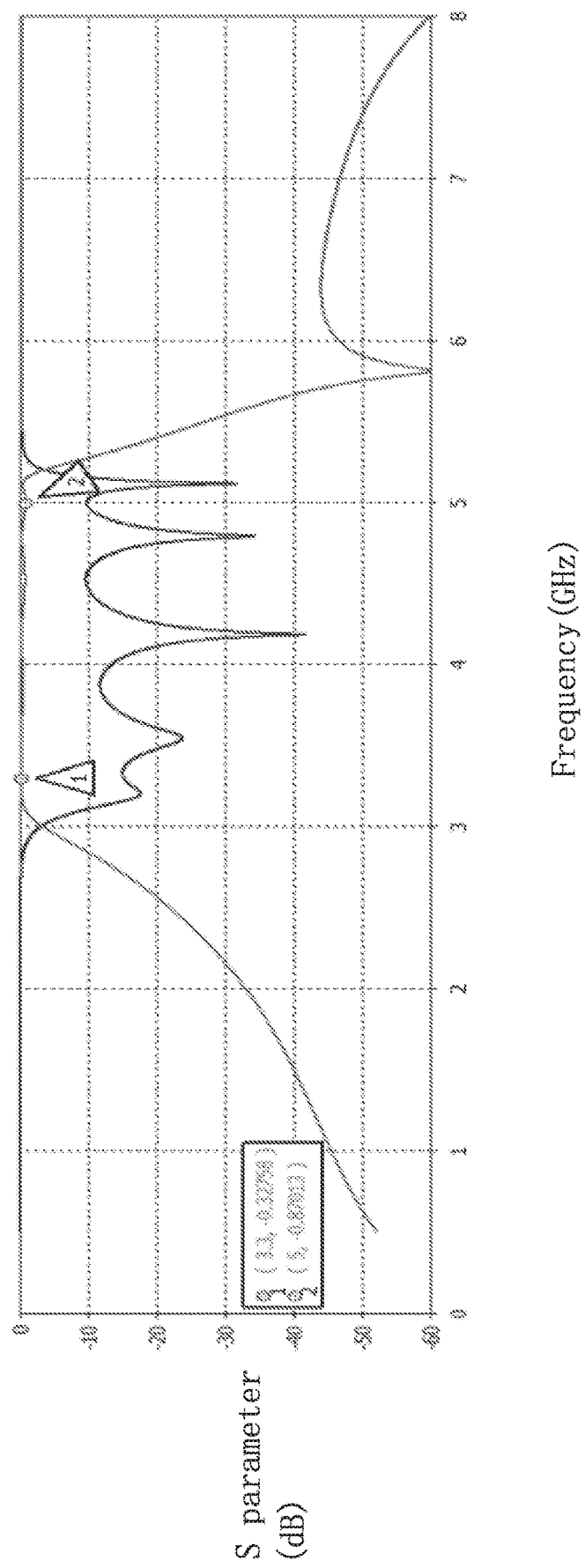
FIG. 9 is a curve graph of an S parameter of the LTCC band-pass filter of the present disclosure.

Referring to FIG. 9, the LTCC band-pass filter 100 completely covers a dual-frequency band of Sub 6G (3.3-3.6 GHz, 4.8-5.0 GH). Meanwhile, overall insertion loss of the passband is controlled within 0.87 dB, reflection coefficient is controlled below −10 dB, and an inner ripple wave of the passband is less than 0.5 dB. Suppression degree of an out-of-band is well, the edge of the passband is steep, and an overall performance is excellent.

The present disclosure provides the LTCC band-pass filter 100, which has a center working frequency of 4200 MHz, width of the passband is 1700 MHz, insertion loss in the passband is equal to or less than 0.87 dB, input/output impedance is 50Ω, and fluctuation in the passband is equal to or less than 0.50 dB.

Compared with the related art, the present disclosure provides the LTCC band-pass filter having following advantages: compatibility of filters is greatly improved when frequency bands of the Sub 6G are completely covered, which reduces the kinds of the filters used in equipment production and assembly process, and improves overall production and manufacturing efficiency.

The above is only the embodiments of the present disclosure, and it should be noted that those skilled in the art can make improvements without departing from the concept of the present disclosure, which are all within the scope of the present disclosure.

What is claimed is:

1. A low temperature co-fired ceramic band-pass filter, comprising:
   a shell and a filtering assembly received in the shell;
   the shell comprising a top wall and a bottom wall opposite to the top wall;
   the filtering assembly comprising a first layer, two second layers respectively overlapped on two opposite sides of the first layer, two third layers, and a fourth layer sandwiched between one of the second layers and the third layers; each of the third layers is overlapped on a side of each of the second layers that is opposite from a side facing the first layer, the first layer, the second layers, the third layers and the fourth layer are perpendicular to the top wall;
   the first layer comprising a first layer top end close to the top wall and a first layer bottom end close to the bottom wall, the first layer top end grounded, the first layer bottom end forming an open circuit state, and the first layer served as an inductance L;
   each of the second layers comprising a second layer top end close to the top wall and a second layer bottom end close to the bottom wall, the second layer top end forming the open circuit state, the second layer bottom end grounded, each of the second layers served as a grounding capacitor C, the second layers and the first layer are coupled together to form an LC resonance unit;

each of the third layers grounded, and served as a shielding layer of the LTCC band-pass filter;

the fourth layer comprising a fourth layer top end close to the top wall and a fourth layer bottom end close to the bottom wall, both the fourth layer top end and the fourth layer bottom end forming the open circuit state, the fourth layer configured for introducing an electrical cross coupling of the first layer and the second layers;

wherein the first layer comprises three first conductors, two second conductors, two connecting bodies, and two third conductors; the three first conductors are disposed in parallel and spaced from each other, the two second conductors are respectively disposed on two opposite sides of the first conductors; two connecting bodies are extended perpendicularly from two ends of the second conductors close to the bottom wall in a direction away from the first conductors; the third conductors extend from the connecting bodies in a direction towards the top wall and parallel to the first conductors; the first conductors, the second conductors, and the third conductors are parallel to each other and spaced from each other; ends of the first conductors and the second conductors close to the top wall are flush with each other; and ends of the first conductors close to the bottom wall are further away from the bottom wall than ends of the second conductors close to the bottom wall.

2. The low temperature co-fired ceramic band-pass filter according to claim 1, wherein a center working frequency of the low temperature co-fired ceramic band-pass filter is 4200 MHz, a width of a passband of the low temperature co-fired ceramic band-pass filter is 1700 MHz, an insertion loss in the passband of the LTCC band-pass filter is equal to or less than 0.87 dB, an input/output impedance of the low temperature co-fired ceramic band-pass filter is 50Ω, and a fluctuation in the passband of the low temperature co-fired ceramic band-pass filter is equal to or less than 0.50 dB.

3. The low temperature co-fired ceramic band-pass filter according to claim 1, wherein the second layer comprises three fourth conductors and two fifth conductors; the three fourth conductors are parallel to each other and disposed at intervals, the two fifth conductors are respectively disposed on two opposite sides of the fourth conductors; the two fifth conductors and the fourth conductors are in parallel and disposed at intervals; ends of the fourth conductors and the fifth conductors close to the bottom wall are flush with each other; ends of the fifth conductors close to the top wall are further away from the top wall than ends of the fourth conductors close to the top wall; the three fourth conductors are respectively overlapped on the three first conductors to form coupling; and the two fifth conductors are respectively overlapped on the two second conductors to form coupling.

4. The low temperature co-fired ceramic band-pass filter according to claim 3, wherein the third layer comprises a flat plate body, two top-end notches, two bottom-end notches, and two side-end notches; the two top-end notches are disposed at intervals at an end of the flat plate body close to the top wall, the two bottom-end notches are disposed at intervals at one end of the flat plate body close to the bottom wall, and the two side-end notches are respectively disposed at two side ends of the flat plate body; orthographic projections of the first layer and the second layer respectively on the third layer are at least partially located in the third layer; two ends of the first conductors of the first layer close to the top wall and close to one side of the second conductors are respectively directly aligned with the two top-end notches; ends of the second conductors of the first layer close to the top wall are directly aligned with the two top-end notches; two third conductors of the first layer respectively extend to be directly aligned with the two side-end notches; two ends close to the top wall of the fourth conductors close to one side of the fifth conductors of the second layer are respectively directly aligned with the two top-end notches.

5. The low temperature co-fired ceramic band-pass filter according to claim 4, wherein the fourth layer comprises a main body part, a first extending part, and a second extending part; the main body part is parallel to the top wall and spaced apart from the top wall, the first extending part perpendicularly extends from one end of the main body part in a direction toward the top wall, and the second extending part perpendicularly extends from another end of the main body toward the bottom wall; one end of the first extending part close to the top wall is directly aligned with one of the top-end notches; and one end of the second extending part close to the bottom wall is aligned with one of the bottom-end notches.

6. The low temperature co-fired ceramic band-pass filter according to claim 4, wherein the ends of the first conductors of the first layer close to the bottom wall are further away from the bottom wall than ends of the fourth conductors of the second layer close to the bottom wall; and ends of the first conductors close to the top wall are flush with ends of the fourth conductors close to the top wall.

7. The low temperature co-fired ceramic band-pass filter according to claim 4, wherein the ends of the second conductors of the first layer close to the bottom wall are flush with ends of the fifth conductors of the second layer close to the bottom wall; and the ends of the second conductors close to the top wall are closer to the top wall than the ends of the fifth conductors close to the top wall.

* * * * *